(12) United States Patent
Hong

(10) Patent No.: US 9,023,665 B2
(45) Date of Patent: May 5, 2015

(54) METHOD AND APPARATUS FOR MANUFACTURING LED DEVICE

(75) Inventor: Seung Min Hong, Gyeonggi-do (KR)

(73) Assignee: Protec Co., Ltd., Namdong-gu, Incheon (KR)

( * ) Notice: Subject to any disclaimer, the term of this patent is extended or adjusted under 35 U.S.C. 154(b) by 649 days.

(21) Appl. No.: 13/352,458

(22) Filed: Jan. 18, 2012

(65) Prior Publication Data

US 2012/0190136 A1    Jul. 26, 2012

(30) Foreign Application Priority Data

Jan. 26, 2011   (KR) .......................... 10-2011-0007668

(51) Int. Cl.
| | |
|---|---|
| H01L 21/00 | (2006.01) |
| F04B 13/00 | (2006.01) |
| F04B 49/06 | (2006.01) |
| H01L 23/00 | (2006.01) |

(52) U.S. Cl.
CPC .......... F04B 13/00 (2013.01); *H01L 2933/0041* (2013.01); *H01L 2224/48091* (2013.01); *H01L 24/48* (2013.01); *H01L 2224/48247* (2013.01); *H01L 2924/00014* (2013.01); F04B 49/06 (2013.01)

(58) Field of Classification Search
None
See application file for complete search history.

(56) References Cited

U.S. PATENT DOCUMENTS

| | | | |
|---|---|---|---|
| 2012/0190136 A1* | 7/2012 | Hong ................................ | 438/7 |
| 2013/0049049 A1* | 2/2013 | Choi ............................... | 257/98 |

* cited by examiner

*Primary Examiner* — Jack Chen
(74) *Attorney, Agent, or Firm* — Ladas & Parry LLP (57) ABSTRACT

An apparatus and method of manufacturing a light emitting diode (LED) device, and more particularly, an apparatus and method of manufacturing an LED device by dispensing a fluorescent solution prepared by mixing a fluorescent material with a liquid synthetic resin, onto an LED chip. An apparatus and method of manufacturing an LED device, whereby an appropriate amount of fluorescent solution simultaneously in consideration of several factors, such as characteristics of an LED chip and viscosity of the fluorescent solution may be dispensed onto the LED chip, is provided. An apparatus and method of manufacturing an LED device, whereby an appropriate amount of fluorescent solution may be calculated actively in consideration of viscosity of the fluorescent solution, a change in characteristics of an LED chip, or the like, and the appropriate amount of fluorescent solution may be dispensed onto the LED chip, is provided.

13 Claims, 5 Drawing Sheets

METHOD AND APPARATUS FOR MANUFACTURING LED DEVICE

CROSS-REFERENCE TO RELATED PATENT APPLICATION

This application claims the benefit of Korean Patent Application No. 10-2011-0007668, filed on Jan. 26, 2011, in the Korean Intellectual Property Office, the disclosure of which is incorporated herein in its entirety by reference.

BACKGROUND OF THE INVENTION

1. Field of the Invention

The present invention relates to a method and apparatus for manufacturing a light emitting diode (LED) device, and more particularly, to a method and apparatus for manufacturing an LED device, whereby a fluorescent solution prepared by mixing a fluorescent material with a liquid synthetic resin is dispensed onto an LED chip.

2. Description of the Related Art

Light emitting diodes (LEDs) are generally manufactured as LED devices by cutting a plurality of LED chips manufactured on a wafer and by mounting the plurality of LED chip on a package. The LED chip each emits blue or red light. When each LED chip is coated with a fluorescent solution including a fluorescent material, color of light generated from an LED device is changed according to the amount of fluorescent material coated. LED devices that emit white light or other color lights may be manufactured by dispensing an appropriate amount of fluorescent solution onto the package on which the LED chips are mounted.

After each LED chip is coated with the fluorescent solution, power is applied to the LED device so that the LED device emits light, and light characteristics of the LED device are tested using a spectroscope. Generally, color coordinates of light emitted from the LED device are measured. The light characteristics of the LED device are represented by values on color coordinates of 1931 international commission on illumination (CIE). Color coordinate values of light generated from the LED chip are changed by the amount of fluorescent material coated. The color coordinate values of the LED device are significant specification of the LED device. When the color coordinate values of the LED device exceed a predetermined range, the LED device is determined as a defective good.

A dispenser for dispensing the fluorescent solution adjusts the amount of fluorescent solution dispensed onto each LED chip, thereby adjusting the color coordinate values of the LED device. In order to adjust the color coordinate values of the LED device by adjusting the amount of fluorescent solution, a dispenser that adjusts the amount of fluorescent solution in a very small unit is required.

Some general dispenser performs test dispensing, measures the weight of a dispensed resin to calculate a dispensing amount (flow rate) for each unit time and then adjusts the dispensing amount by using the calculated dispensing amount (flow rate). However, the minimum unit of weight that may be measured by a scale with a proper price is about 1 to 10 g. Since the minimum unit of weight that may be measured by using a scale is limited, there is a limitation in finely adjusting the amount of fluorescent solution by using general methods.

The fluorescent solution used in a process of manufacturing an LED device is hardened as time elapses, and viscosity of the fluorescent is changed. Viscosity of the fluorescent solution is also changed according to temperature. Since viscosity of the fluorescent solution is changed non-linearly with respect to a factor, such as temperature, or the like, it is very difficult to apply viscosity of the fluorescent solution calculated by a numerical value to the dispenser. The content of the fluorescent material mixed in the fluorescent solution may be changed slightly every time. A dispensing environment is continuously changed due to mechanical characteristics or an unmeasurable factor of the dispenser. General dispensers cannot meet with such a change. In particular, characteristics of the LED chip supplied to a process of dispensing the fluorescent solution are not constant due to a condition of the previous process in which the LED chip is manufactured. Thus, an apparatus and method of manufacturing an LED device that may adjust light characteristics of the LED device in consideration of the circumstances is required.

SUMMARY OF THE INVENTION

The present invention provides an apparatus and method of manufacturing a light emitting diode (LED) device, whereby an appropriate amount of fluorescent solution simultaneously in consideration of several factors, such as characteristics of an LED chip and viscosity of the fluorescent solution may be dispensed onto the LED chip.

According to an aspect of the present invention, there is provided a method of manufacturing a light emitting diode (LED) device by dispensing a fluorescent solution prepared by mixing a fluorescent material with a liquid synthetic resin, onto an LED chip, the method including: (a) dispensing the fluorescent solution onto a plurality of LED chips, respectively, by using a dispenser; (b) measuring light characteristics of light emitted from the plurality of LED chips by applying power to at least a portion of the plurality of LED chips undergoing the operation (a); (c) calculating a representative value of the light characteristics measured in operation (b); (d) determining an amount of fluorescent solution to be dispensed by the dispenser by using the representative value of the light characteristics calculated in operation (c) and feeding back the amount of fluorescent solution to the dispenser; and (e) dispensing the fluorescent solution having the amount determined in operation (d) onto the plurality of LED chips, respectively, by using the dispenser.

According to another aspect of the present invention, there is provided a method of manufacturing a light emitting diode (LED) device by dispensing a fluorescent solution prepared by mixing a fluorescent material with a liquid synthetic resin, onto an LED chip, the method including: (f) dispensing the fluorescent solution onto a plurality of LED chips, respectively, by using a first dispenser; (g) measuring light characteristics of light emitted from the plurality of LED chips by applying power to at least a portion of the plurality of LED chips undergoing the operation (f); (h) calculating a representative value of the light characteristics measured in operation (g); (i) determining an amount of fluorescent solution to be supplemented to the plurality of LED chips by using the representative value of the light characteristics calculated in operation (h) and transferring the amount of fluorescent solution to a second dispenser; and (j) dispensing the fluorescent solution having the amount determined in operation (i) onto the plurality of LED chips, respectively, by using the second dispenser.

According to another aspect of the present invention, there is provided an apparatus for manufacturing a light emitting diode (LED) device by dispensing a fluorescent solution prepared by mixing a fluorescent material with a liquid synthetic resin, onto an LED chip, the apparatus including: a dispenser for dispensing the fluorescent solution onto a plurality of LED chips, respectively, by using a dispenser; a measuring unit for measuring light characteristics of light emitted from the plurality of LED chips by applying power to at least a portion of the plurality of LED chips on which the fluorescent solution is dispensed by the dispenser; a transfer unit for transferring the LED chips from the dispenser to the measuring unit; and a controlling unit for controlling the dispenser to calculate a representative value of light characteristics of the plurality of chips based on the light characteristics measured by the measuring unit and to adjust an amount of fluorescent solution to be dispensed by the dispenser on each LED chip by using the representative value.

According to another aspect of the present invention, there is provided an apparatus for manufacturing a light emitting diode (LED) device by dispensing a fluorescent solution prepared by mixing a fluorescent material with a liquid synthetic resin, onto an LED chip, the apparatus including: a first dispenser for dispensing the fluorescent solution onto a plurality of LED chips, respectively; a measuring unit for measuring light characteristics of light emitted from the plurality of LED chips by applying power to at least a portion of the plurality of LED chips on which the fluorescent solution is dispensed by the first dispenser; a second dispenser for additionally dispensing the fluorescent solution onto the LED chips on which measurement is completed by the measuring unit; and a transfer unit for transferring the LED chips to the first dispenser and the second dispenser sequentially; and a controlling unit for controlling the second dispenser to calculate a representative value of the light characteristics of the plurality of LED chips based on the light characteristics measured by the measuring unit and to adjust an amount of fluorescent solution to be dispensed by the second dispenser on each LED chip by using the representative value.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings in which exemplary embodiments of the invention are shown.

Figure 1:
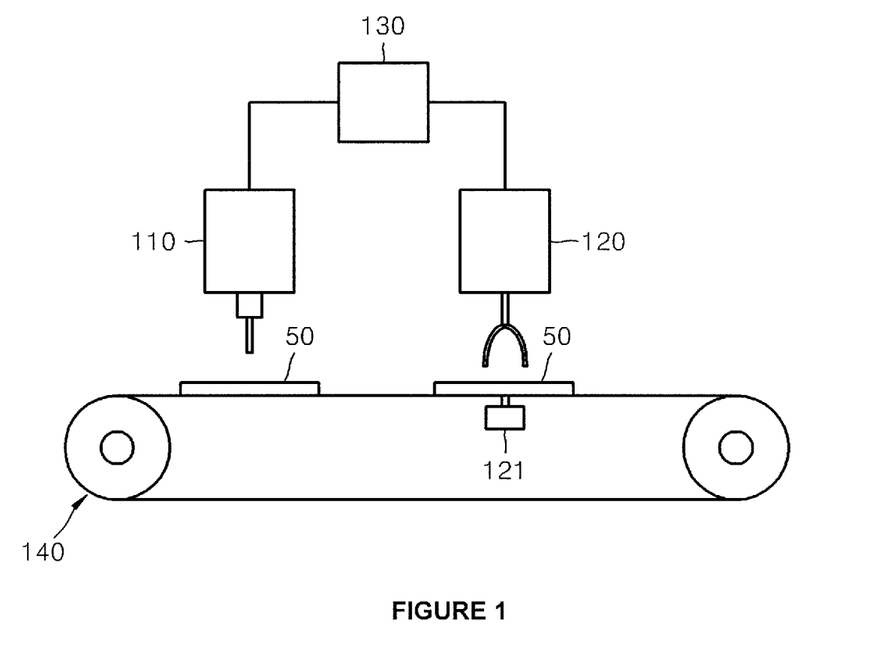
FIG. 1 is a schematic view of an apparatus for manufacturing a light emitting diode (LED) device, according to an embodiment of the present invention.
Figure 2:
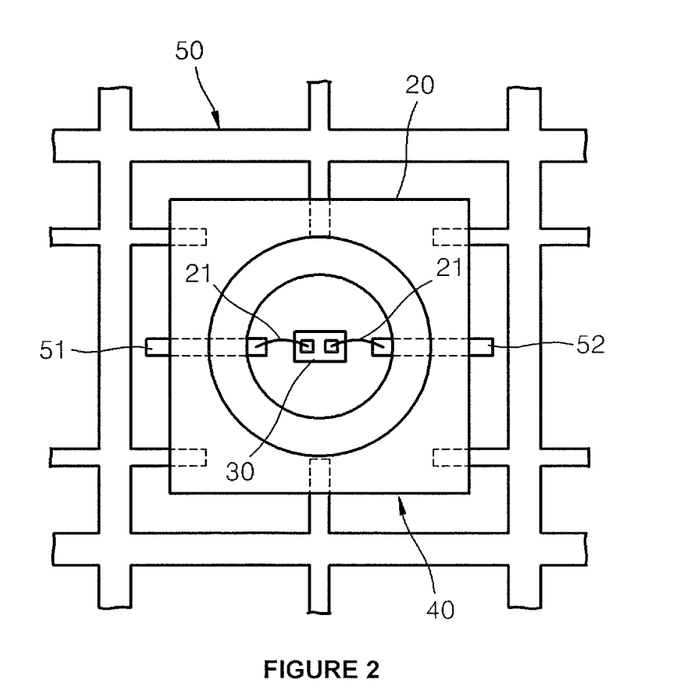
FIG. 2 is a partial perspective view of a lead frame used in a method and apparatus for manufacturing an LED device according to the present invention.
Figure 3:
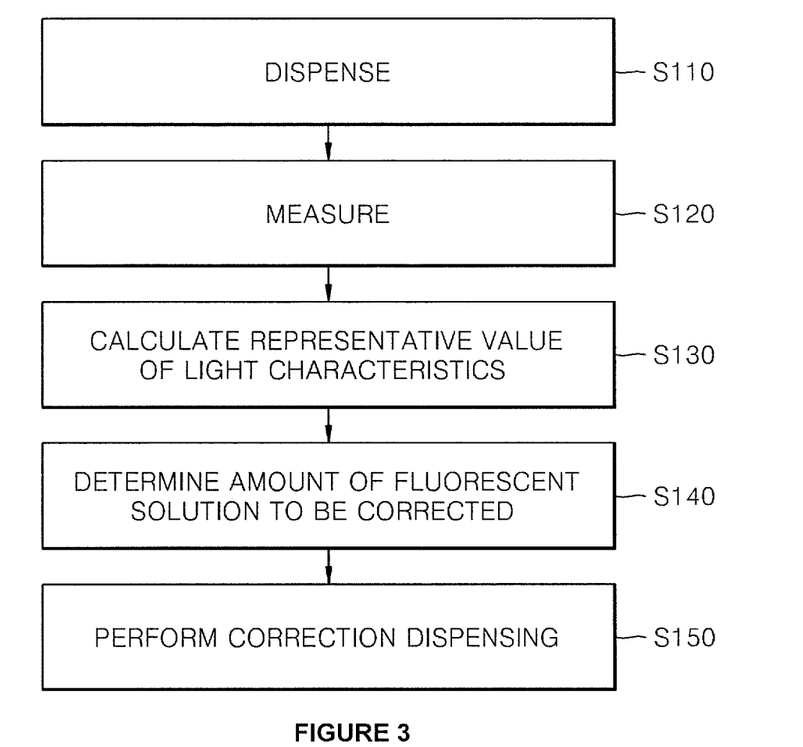
FIG. 3 is a flowchart illustrating a method of manufacturing an LED device, according to an embodiment of the present invention.

FIG. 1 is a schematic view of an apparatus for manufacturing a light emitting diode (LED) device, according to an embodiment of the present invention, and FIG. 2 is a partial perspective view of a lead frame used in a method and apparatus for manufacturing an LED device according to the present invention, and FIG. 3 is a flowchart illustrating a method of manufacturing an LED device, according to an embodiment of the present invention.

The method of manufacturing an LED device illustrated in FIG. 3 is performed using the apparatus for manufacturing an LED device illustrated in FIG. 1.

First, the apparatus for manufacturing an LED device illustrated in FIG. 1 will be described below.

The apparatus for manufacturing an LED device illustrated in FIG. 1 includes a dispenser 110, a measuring unit 120, a controlling unit 130, and a transfer unit 140.

The dispenser 110 dispenses a fluorescent solution onto an LED chip 30. The fluorescent solution is prepared by mixing a fluorescent material with a liquid synthetic resin, such as epoxy, silicon, or the like. If a predetermined amount of time elapses after the fluorescent solution is dispensed onto the LED chip 30, the fluorescent solution is hardened and is in a solid state. Due to the fluorescent material included in the fluorescent solution, color of light generated from the LED chip 30 is changed, and the light is irradiated towards the outside. In addition, the fluorescent solution is hardened and serves to stably support and protect the LED chip 30. It is very significant in adjusting light characteristics of the LED device 40 to precisely adjust the amount of fluorescent solution.

The dispenser 110 dispenses a constant amount of fluorescent solution onto the LED chip 30. The dispenser 110 is configured to move forward and backward, right and left, and upward and downward, if necessary.

A plurality of LED chips 30 are disposed on the dispenser 110 at regular intervals. A set of the plurality of LED chips 30 supplied to the apparatus for manufacturing an LED device illustrated in FIG. 1 so as to be processed as in one unit in this way is referred to as an LED array. A representative LED array may be a lead frame 50 illustrated in FIG. 2. The lead frame 50 is configured by disposing a formation material (package 20) having a synthetic resin shape on a metal thin plate at regular intervals. The LED chips 30 are bonded to each package 20, and a positive electrode and a negative electrode of each LED chip 30 are bonded to an electrode pad of the package 20 via a wire 21 and are electrically connected to the electrode pad of the package 20. The lead frame 50 is supplied to the apparatus for manufacturing an LED device illustrated in FIG. 1 by using a device, such as a general loader. If an operation of supplying the lead frame 50 to the apparatus for manufacturing an LED device illustrated in FIG. 1 is completed, the lead frame 50 is discharged from the apparatus for manufacturing an LED device illustrated in FIG. 1.

The dispenser 110 dispenses a predetermined amount of fluorescent solution onto each LED chip 30 of the lead frame 50. The lead frame 50 having other structures than the lead frame 50 illustrated in FIG. 2 may be used. The above-described LED array is not limited to the shape of the lead frame 50. An LED array having a palette shape on which a plurality of ceramic packages are disposed, may also be used.

Referring to FIG. 1, after power is applied to the LED chip 30 onto which the fluorescent solution is dispensed by the dispenser 110 and the LED chip 30 emits light, the measuring unit 120 measures light characteristics of the LED chip 30. The light characteristics of the LED chip 30 include luminous intensity, brightness, light temperature, and the like. In the present embodiment, the case where color coordinate values (CIE rank) of 1931 international commission on illumination (CIE) are measured by the measuring unit 120 will be described.

Light characteristics of the LED device 40 mounted on the lead frame 50 may be measured when a positive electrode 51 and a negative electrode 52 of a power terminal of the lead frame 50 are electrically isolated from each other, as illustrated in FIG. 2. The measuring unit 120 may be configured in various ways. However, in the present embodiment, a probe 121 is in contact with the LED device 40 in a downward direction of the lead frame 50, as illustrated in FIG. 1, and power is applied to the LED device 40, and light is generated from the LED device 40, and a light receiving unit disposed on an upper portion of the lead frame 50 receives the light, and the measuring unit 120 measures light characteristics of the LED device 40.

The transfer unit 140 transfers the lead frame 50 from the dispenser 110 to the measuring unit 120 and conveys the lead frame 50 from the measuring unit 120 back to the dispenser 110, if necessary. The measuring unit 120 may measure light characteristics of each LED device 40 while moving forward and backward and right and left when the lead frame 50 is fixed, so as to measure light characteristics of the plurality of LED devices 40 of the lead frame 50, respectively. Alternatively, the measuring unit 120 may measure light characteristics of each LED device 40 while the transfer unit 140 allows the lead frame 50 to move forward and backward and right and left when the measuring unit 120 is fixed.

The controlling unit 130 calculates a representative value of light characteristics of the plurality of LED devices 40 based on a light characteristic value of each LED device 40 measured by the measuring unit 120. The representative value is a statistical term that means a value for representing a center of statistical data. The representative value includes a mean value, a median, a value having the most frequency (mode), and the like. In the present embodiment, the case where a mean value of color coordinate values of each LED device 40 is calculated as the representative value will be described. A standard deviation of each LED device 40 may also be additionally calculated.

Figure 4:
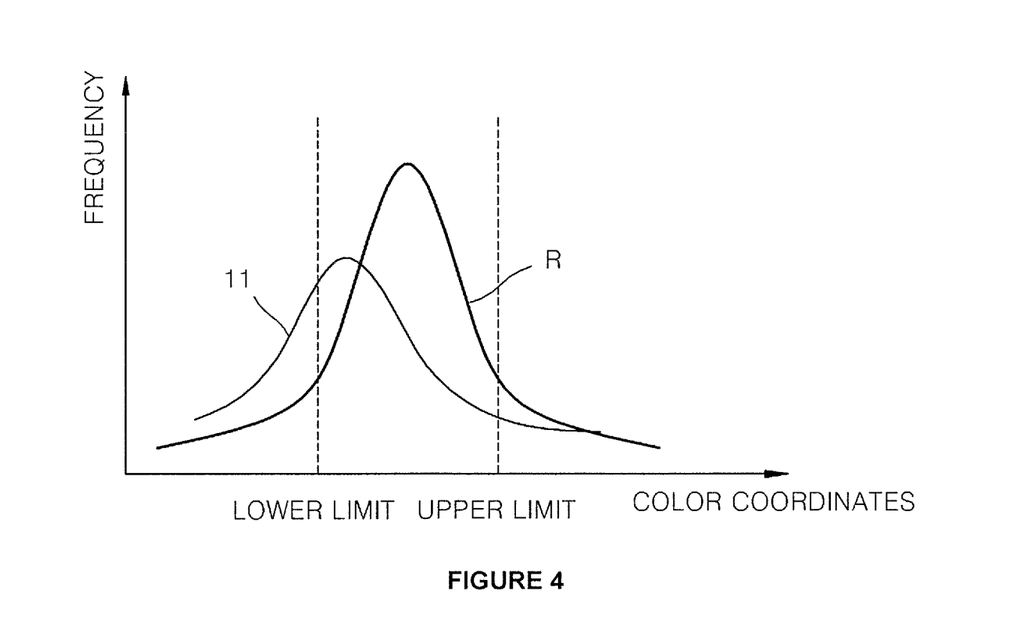
FIGS. 4 through 6 illustrate an operation of adjusting light characteristics of an LED device in a method and apparatus for manufacturing an LED device according to the present invention.

Significant specification of the LED device 40 is color coordinate values of light that is generated from the LED device 40. The specification of such color coordinate values is generally defined by a target value of the color coordinate values and a lower limit value and an upper limit value based on the target value. FIG. 4 illustrates reference distribution R having a target value of color coordinate values.

The controlling unit 130 calculates distribution 11 of the color coordinate values by calculating a color coordinate mean value and a standard deviation of the LED device 40 of the lead frame 50 and compares the distribution 11 with the reference distribution R, as illustrated in FIG. 4. Since the color coordinate values of the LED device 40 are most affected by the amount of fluorescent solution, the color coordinate values of the LED device 40 may be changed by adjusting the amount of fluorescent solution to be dispensed by the dispenser 110.

The controlling unit 130 calculates a value of the fluorescent solution required for moving the mean value of the color coordinate values of the lead frame 50 in this way and transfers the calculated value to the dispenser 110, thereby adjusting the amount of fluorescent solution. A correlation between the amount of fluorescent solution and the color coordinate values of the LED device 40 may be summarized by using a method, such as an experiment, or the like, in advance and may be made as a database, and the controlling unit 130 may calculate a value of the fluorescent solution to be dispensed to correct the color coordinate values by inquiring the database.

The controller unit 130 may adjust the color coordinate values of the LED device 40 largely by using two methods. The first method is to dispense a little insufficient amount of fluorescent solution by using the dispenser 110, to calculate a mean value of the color coordinate values and then to calculate a value of the fluorescent solution to be additionally dispensed, thereby performing supplementary dispensing.

The second method is to dispense a fluorescent solution of which amount is determined as the most appropriate amount by using a method, such as an experiment, or the like, onto a first LED array and to measure color coordinate values of the first LED array, thereby calculating a mean value of the color coordinate values. The operation on the first LED array is completed, and the first LED array is discharged. After the mean value of the color coordinate values of the first LED array and the color coordinate target value of the first LED array are compared, a value of the fluorescent solution to be added or reduced so as to remove a difference between the mean value of the color coordinate values of the first LED array and the color coordinate target value of the first LED array is calculated by the controlling unit 130. The dispenser 110 dispenses the fluorescent solution having a corrected amount on the next LED array (second LED array) by reflecting the value calculated by the controlling unit 130. This is to correct an error between a target value and color coordinate values of each LED array measured in real-time.

Hereinafter, the method of manufacturing an LED device illustrated in FIG. 3 will be described by using the apparatus for manufacturing an LED device, having the above structure illustrated in FIG. 1.

First, the fluorescent solution is dispensed onto the lead frame 50 by using the dispenser 110 (operation (a); S110). The fluorescent solution is dispensed onto all LED chips 30 of the lead frame 50, respectively. In this regard, the dispenser 110 dispenses the fluorescent solution having a little smaller amount than the amount of fluorescent solution required in consideration of further correction.

The transfer unit 140 transfers the lead frame 50 to the measuring unit 120, and the measuring unit 120 measures color coordinate values by applying power to each LED device 40 of the lead frame 50 sequentially (operation (b); S120). In this regard, the measuring unit 120 may measure color coordinate values of all LED devices 40 of the lead frame 50 and may perform measurement only on some LED device 40 that are randomly selected from among all LED devices 40 so as to reduce a process time, if necessary.

The color coordinate values measured by the measuring unit 120 are transferred to the controlling unit 130, and the controlling unit 130 calculates a mean value of the measured color coordinate values (operation (c); S130).

Referring to FIG. 4, the controlling unit 130 calculates a difference between the mean value of measured color coordinate values 11 of the LED devices 40 and a color coordinate target value based on reference distribution R. The controlling unit 130 calculates the amount of fluorescent solution required to coincide the mean value of the color coordinate values 11 of the LED devices 40 with the color coordinate target value, thereby feeding back the calculated amount of fluorescent solution to the dispenser 110 (operation (d); S140). In this regard, a database that is made by summarizing a correlation between the amount of fluorescent solution and the color coordinate values, as described above, may be used.

Figure 5:
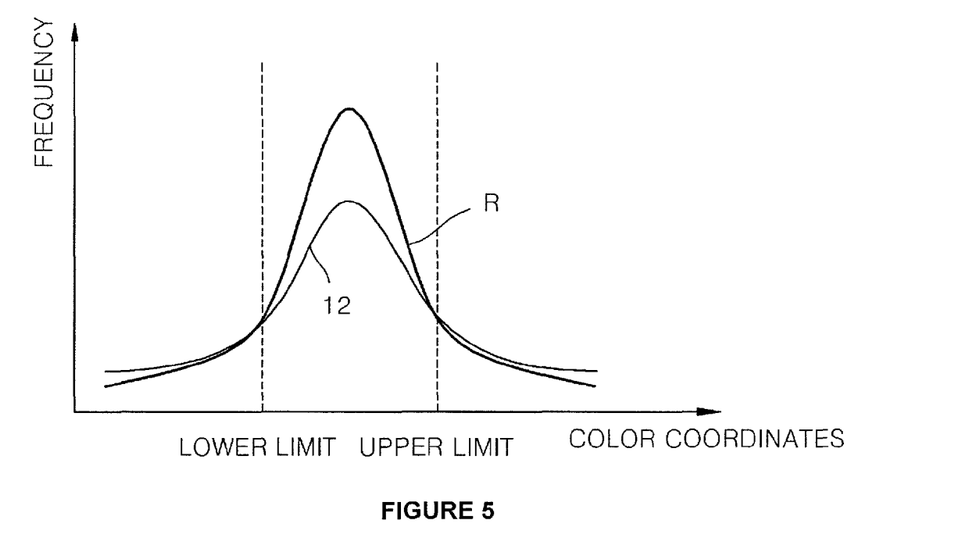

The transfer unit 140 conveys the lead frame 50 back to the dispenser 110, and the dispenser 110 additionally dispenses the fluorescent solution onto each LED device 40 of the lead frame 50 based on the value transferred by the controlling unit 130 (operation (e); S150). By performing additional dispensing in this way, distribution 12 of color coordinate values of the lead frame 50 is close to the reference distribution R, as illustrated in FIG. 5. That is, the controlling unit 130 controls the dispenser 110 to additionally dispense the fluorescent solution so that the mean value of the color coordinate values of the lead frame 50 is close to a central value of the reference distribution R.

The method of manufacturing an LED device illustrated in FIG. 3 includes performing preparatory dispensing the fluorescent solution onto one lead frame 50 and performing additional dispensing the fluorescent solution after measurement.

If necessary, the method of manufacturing an LED device illustrated in FIG. 3 may be implemented by dispensing the fluorescent solution having the most appropriate amount onto a first-supplied lead frame 50 (first LED array) and completing measurement and then by dispensing the fluorescent solution having a value corrected according to the result of measurement onto the next lead frame 50 (second LED array).

That is, operations (a), (b), and (c) are performed on the first LED array, and in operation (d), the controlling unit 130 calculates the amount of fluorescent solution that is the most appropriate when the fluorescent solution is dispensed onto a new LED chip 30 based on the result of operation (c). In this way, the dispenser 110 dispenses the fluorescent solution having the corrected amount onto the next lead frame 50 (second LED array) according to the calculated values (operation (e); S150).

Figure 6:
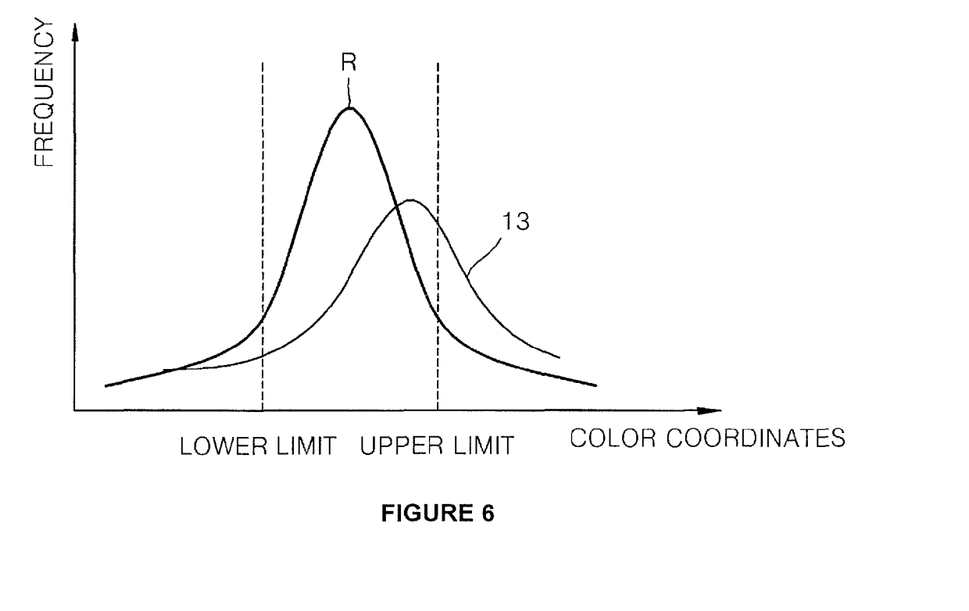

In such a method, the amount of fluorescent solution may be corrected by increasing or decreasing the amount of fluorescent solution. That is, when the distribution 13 of color coordinate values of the first LED array is as illustrated in FIG. 6, by decreasing the amount of fluorescent solution to be dispensed onto the second LED array, the distribution 12 of color coordinate values of the second LED array may be adjusted, as illustrated in FIG. 5. The amount of fluorescent solution to be dispensed onto the following lead frame 50 may also be increased or decreased based on the result of dispensing onto the preceding lead frame 50.

Since a liquid synthetic resin of the fluorescent solution stored in the dispenser 110 is hardened as time elapses, viscosity of the fluorescent solution is not constant and is continuously changed. In addition, an optimum value of the fluorescent solution to be dispensed may be finely changed according to various factors, such as ambient temperature, characteristics of the LED chip 30 bonded to the lead frame 50, and the like. If necessary, a mixture ratio of the synthetic resin of the fluorescent solution with respect to the fluorescent material may be changed according to situations. The most appropriate amount of fluorescent solution according to several factors that are changed in real-time may be inferred from color coordinate values measured from the lead frame 50 dispensed immediately before.

Meanwhile, stock of all LED devices 40 may be managed by managing a mean value of light characteristics of a plurality of LED devices 40, as described above. For example, in a state where LED devices 40 having a mean value that is smaller than a color coordinate target value of the reference distribution R, as illustrated in FIG. 4, are manufactured, the LED devices 40 are additionally manufactured by configuring distribution 13 of color coordinate values of the LED devices 40 to intentionally have a greater mean value than the color coordinate target value, as illustrated in FIG. 6 so that a mean value of the distribution 12 of all stocks may coincide with the color coordinate target value of the reference distribution R, as illustrated in FIG. 5. By introducing the concept of the color coordinate mean value to the LED device 40 manufactured by dispensing the fluorescent solution, the quality of all LED devices 40 may be controlled, and stock may be reduced.

Operation (e) may include adjusting the fluorescent solution so that a measured color coordinate mean value of LED chips 30 coincides with a color coordinate target value. However, the amount of fluorescent solution may be adjusted so that the color coordinate mean value is intentionally greater than or smaller than the color coordinate target value so as to coincide the whole mean value of the first LED array and the second LED array with the target value.

In addition, color coordinate values of each LED device 40 of two or more lead frames 50 on which dispensing and measurement have been completed, are accumulated to calculate a mean value of the color coordinate values, and the amount of fluorescent solution of the next lead frame 50 to be dispensed may be adjusted based on the mean value of the color coordinate values.

The amount of fluorescent solution is not adjusted in units of each LED device 40, as described above, but is adjusted using a mean value of light characteristics of the plurality of LED devices 40. By using the method described above, the present invention may manage statistically and may improve the quality of all LED devices 40 statistically in consideration of the effect of various error occurrence factors.

In particular, a white LED device that is mainly used for lighting generally constitutes one lighting by combining a plurality of LED devices. Thus, a mean value of color coordinate values of a plurality of LED devices and a standard deviation thereof, as well as color coordinate values of each LED device, are significant. The amount of fluorescent solution of each LED device may be adjusted using the concept of a representative value of light characteristics like in the present embodiment so that the quality of all LED devices may be more effectively controlled.

Meanwhile, after all LED chips 30 of the lead frame 50 are dispensed (operation (a); S110), light characteristics of the LED chips 30 of the lead frame 50 are measured (operation (b); S120), as described above. However, dispensing and measurement may also be sequentially performed on each LED chip 30 of the lead frame 50.

Various well-known methods of adjusting the amount of fluorescent solution by using the dispenser 110 may be used. After the amount (flow rate) of the fluorescent solution coated by the dispenser 110 for a unit time is set constant, a dispensing amount may be adjusted using a length of time when a nozzle of the dispenser 110 is opened. The dispensing amount may also be adjusted by adjusting the number of times when the nozzle of the dispenser 110 is opened, using a valve.

Next, an apparatus for manufacturing an LED device, according to another embodiment of the present invention will be described with reference to FIG. 7.

Figure 7:
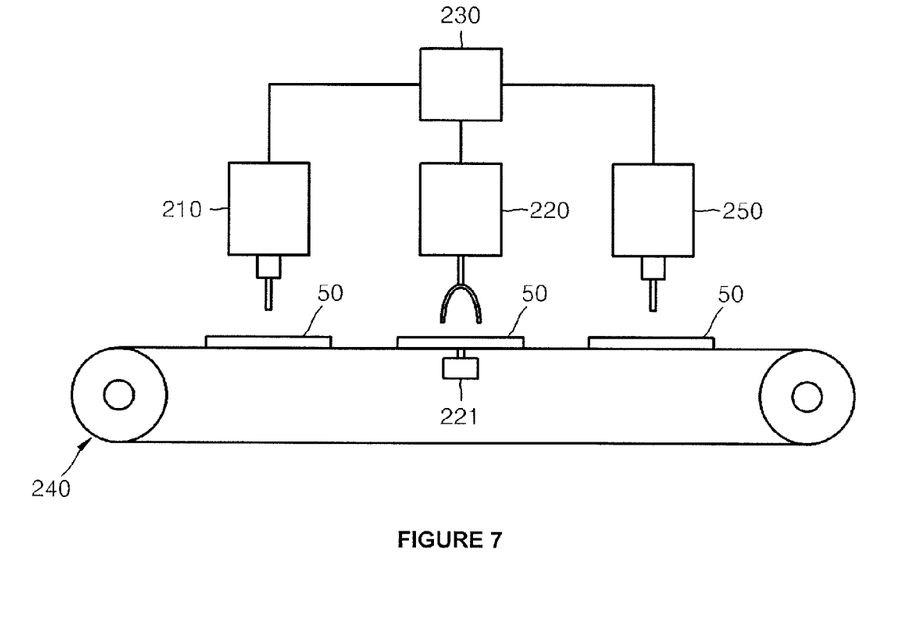
FIG. 7 is a schematic view of an apparatus for manufacturing an LED device, according to another embodiment of the present invention.

The apparatus for manufacturing an LED device illustrated in FIG. 7 is characterized by including two dispensers 210 and 250, such as a first dispenser 210 and a second dispenser 250. A measuring unit 220 is disposed between the first dispenser 210 and the second dispenser 250. A transfer unit 240 transfers a lead frame 50 to the first dispenser 210, the measuring unit 220, and the second dispenser 250, sequentially.

A controlling unit 230 adjusts the amount of fluorescent solution to be dispensed by the first dispenser 210 and the second dispenser 250 based on light characteristic values of the LED device measured by the measuring unit 220.

For example, the first dispenser 210 dispenses the fluorescent solution having a smaller amount than the amount of fluorescent solution required to have a light characteristic target value, and the second dispenser 250 additionally dispenses the amount of fluorescent solution required to have a light characteristic target value based on a value determined by the controlling unit 230, thereby adjusting light characteristics of the LED device.

Hereinafter, a method of manufacturing an LED device, according to another embodiment of the present invention by using the apparatus for manufacturing an LED device illustrated in FIG. 7 will be described.

Figure 8:
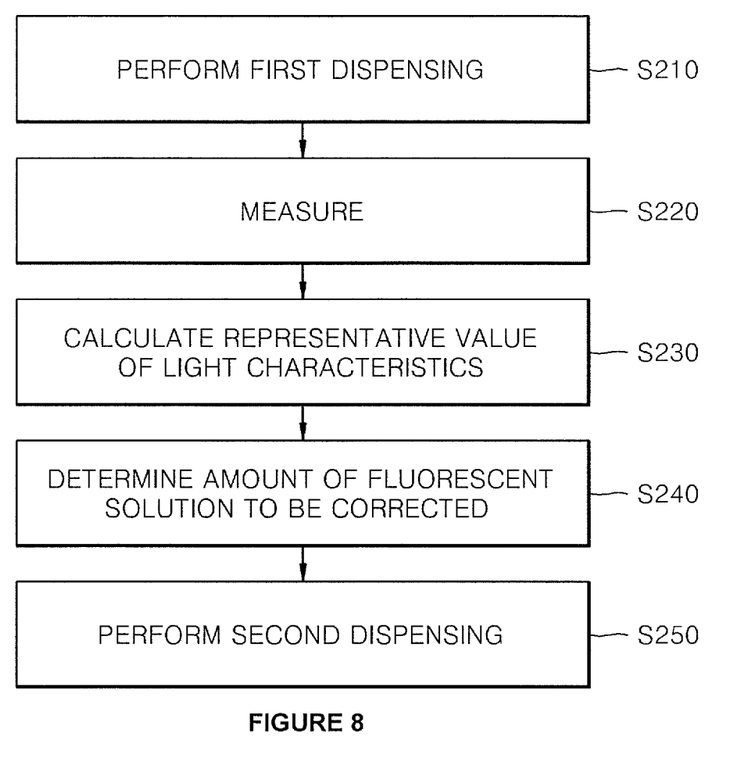
FIG. 8 is a flowchart illustrating a method of manufacturing an LED device, according to another embodiment of the present invention.

FIG. 8 is a flowchart illustrating a method of manufacturing an LED device, according to another embodiment of the present invention.

Referring to FIG. 8, the method of manufacturing an LED device according to the present embodiment includes, first, dispensing a smaller amount of fluorescent solution than a required amount onto each LED device of the lead frame 50 by using the first dispenser 210 (operation (f); S210).

The transfer unit 240 transfers the lead frame 50 to the measuring unit 220, and the measuring unit 220 allows a probe 221 to be in contact with each LED chip of the lead frame 50 and applies power to the LED chip, thereby measuring color coordinate values of the LED chip (operation (g): S220).

The controlling unit 230 calculates a mean value of the color coordinate values of each LED device of the lead frame 50 based on the value measured by the measuring unit 220 (operation (h); S230).

By considering a difference between a color coordinate target value of reference distribution R and the mean value of color coordinate values 11 of each LED device, as illustrated in FIG. 4, the amount of fluorescent solution to be supplemented to LED devices of the lead frame 50 is determined and is transferred to the second dispenser 250 (operation (i); S240).

The transfer unit 240 transfers the lead frame 50 to the second dispenser 250, and the second dispenser 250 dispenses the fluorescent solution of which amount is adjusted by the controlling unit 230, on each LED device of the lead frame 50 (operation (j); S250).

In the apparatus for manufacturing an LED device illustrated in FIG. 7 and the method of manufacturing an LED device illustrated in FIG. 8, while the second dispenser 250 performs correction dispensing, dispensing may be performed by the first dispenser 210 onto a new lead frame 50 so that a working time may be reduced and productivity may be improved.

Various modified methods of the apparatus for manufacturing an LED device illustrated in FIG. 1 and the method of manufacturing an LED device illustrated in FIG. 3 may be applied to the apparatus for manufacturing an LED device illustrated in FIG. 7 and the method of manufacturing an LED device illustrated in FIG. 8.

As described above, in an apparatus and method of manufacturing an LED device according to the one or more embodiments of the present invention, an appropriate amount of fluorescent solution may be calculated actively in consideration of viscosity of the fluorescent solution, a change in characteristics of an LED chip, or the like, and the appropriate amount of fluorescent solution may be dispensed onto the LED chip.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a light emitting diode (LED) device by dispensing a fluorescent solution prepared by mixing a fluorescent material with a liquid synthetic resin, onto an LED chip, the method comprising:
    (a) dispensing the fluorescent solution onto a plurality of LED chips, respectively, by using a dispenser;
    (b) measuring light characteristics of light emitted from the plurality of LED chips by applying power to at least a portion of the plurality of LED chips undergoing the operation (a);
    (c) calculating a representative value of the light characteristics measured in operation (b);
    (d) determining an amount of fluorescent solution to be dispensed by the dispenser by using the representative value of the light characteristics calculated in operation (c) and feeding back the amount of fluorescent solution to the dispenser; and
    (e) dispensing the fluorescent solution having the amount determined in operation (d) onto the plurality of LED chips, respectively, by using the dispenser.

2. The method of claim 1, wherein the operations (a), (b), and (c) are performed in units of an LED array comprising a plurality of LED chips.

3. The method of claim 2, wherein the LED array comprises a lead frame formed by bonding the plurality of LED chips.

4. The method of claim 2, wherein the representative value of the operation (c) comprises a mean value, and the operation (a) comprises dispensing a smaller amount of fluorescent solution than an amount of fluorescent solution required to have a light characteristic target value of each LED chip, and the operation (d) comprises determining the amount of fluorescent amount to be additionally dispensed so as to coincide a mean value of light characteristics of the LED array on which the operations (a), (b), and (c) are performed, with the light characteristic target value of each LED chip, and the operation (e) comprises additionally dispensing the fluorescent solution onto each LED chip of the LED array on which the operations (a), (b), and (c) are performed, by the amount calculated in the operation (d).

5. The method of claim 4, wherein the operation (e) is performed by conveying the LED array back to the dispenser on which the operation (a) is performed, the operation (b) is performed by transferring the LED array to a light characteristic testing device and then the operation (a) is performed again.

6. The method of claim 2, wherein the operations (a), (b), and (c) are performed on a first LED array, and the operation (d) comprises correcting an amount of fluorescent solution to be dispensed onto each LED chip in consideration of a difference between the light characteristic target value of each LED chip and a mean value of light characteristics of the first LED array, and the operation (e) comprises dispensing the fluorescent solution onto a second LED array based on a value corrected in the operation (d).

7. The method of claim 6, wherein the operation (d) comprises correcting the amount of fluorescent solution so that a light characteristic mean value of the second LED array coincides with the light characteristic target value of the LED chip.

8. The method of claim 6, wherein the operation (d) comprises correcting the amount of fluorescent solution so that each light characteristic mean value of the first LED array and the second LED array coincides with the light characteristic target value of the LED chip.

9. The method of claim 1, wherein the operation (d) is performed using a database made by summarizing a correlation between a dispensing amount of fluorescent solution and the light characteristic value of the LED chip.

10. The method of claim 1, wherein the light characteristics measured in the operation (b) comprise CIE color coordinate values.

11. The method of claim 2, wherein the operations (c), (d), and (e) are performed after the operations (a) and (b) are sequentially performed on each LED chip of the LED array.

12. The method of claim 2, wherein the operation (b) is performed on all LED chips undergoing the operation (a).

13. The method of claim 1, wherein an amount (flow rate) of the fluorescent solution coated by the dispenser for a unit time is constant, and the dispenser adjusts a dispensing amount by a length of time when a nozzle of the dispenser is opened.

* * * * *